United States Patent

Fukino

[15] 3,704,398

[45] Nov. 28, 1972

[54] MULTI-EMITTER POWER TRANSISTOR HAVING EMITTER REGION ARRANGEMENT FOR ACHIEVING SUBSTANTIALLY UNIFORM EMITTER-BASE JUNCTION TEMPERATURES

[72] Inventor: Katsushige Fukino, Tokyo, Japan

[73] Assignee: Nippon Electric Co., Ltd., Tokyo, Japan

[22] Filed: Feb. 10, 1971

[21] Appl. No.: 114,169

[30] Foreign Application Priority Data

Feb. 14, 1970 Japan ......................45/12453

[52] U.S. Cl.........317/235 R, 317/235 Y, 317/235 Z, 317/235 AB, 29/587

[51] Int. Cl...........................H01l 11/00, H01l 15/00

[58] Field of Search.........317/235 X, 235 Y, 235 Z, 317/235 AA, 235 AB; 148/175; 29/287, 589

[56] References Cited

UNITED STATES PATENTS

| | | | |
|---|---|---|---|
| 2,994,810 | 8/1961 | Gudmundsen | 317/235 Z |
| 3,252,063 | 5/1966 | Ziffer | 317/235 Z |
| 3,325,706 | 6/1967 | Kruper | 317/235 Z |
| 3,381,186 | 4/1968 | Arends | 317/235 |
| 3,390,280 | 6/1968 | Thompson | 317/235 Z |
| 3,476,992 | 11/1969 | Chu | 317/235 AB |
| 3,599,061 | 8/1971 | Kokosa | 317/235 |

FOREIGN PATENTS OR APPLICATIONS

| | | | |
|---|---|---|---|
| 447,669 | 5/1965 | Japan | 317/235 |

*Primary Examiner*—James D. Kallam
*Assistant Examiner*—Andrew J. James
*Attorney*—Sandoe, Hopgood & Calimafde

[57] ABSTRACT

A transistor having a plurality of divided emitter regions. The spacing between adjacent emitter regions at the central portion of the transistor is greater than that between adjacent peripheral emitter regions. This arrangement provides a more uniform distribution of junction temperatures. The structure finds particular utility in power transistors.

7 Claims, 10 Drawing Figures

PATENTED NOV 28 1972 3,704,398

INVENTOR
Katsushige Fukino by

Sandoe, Hopgood & Calimafde
ATTORNEYS

*INVENTOR*
Katsushige Fukino

*by*
Sandoe, Hopgood & Calimafde
ATTORNEYS

MULTI-EMITTER POWER TRANSISTOR HAVING EMITTER REGION ARRANGEMENT FOR ACHIEVING SUBSTANTIALLY UNIFORM EMITTER-BASE JUNCTION TEMPERATURES

This invention relates generally to transistors and, more particularly, to an improved structure of a planar electrode arrangement of a power transistor pellet.

The loss of electric power in transistors appears mainly at the collector-base pn junction (hereinafter referred to simply as the collector junction) which transforms into heat and raises the temperature of the junction to thereby temporarily cause the electrical characteristics of the transistor to deteriorate, and to occasionally cause irreversible destruction of the transistor. Therefore, in the case of power transistors which have relatively large power losses, it is very important to prevent the temperature rise at the junction.

A power transistor deals with large current or power, and thus, inevitably, requires the provision of large emitter and collector junction areas. Accordingly, in order to avoid concentration of heat generation and to improve the electrical characteristics of the transistor, the emitter junction has customarily been divided and connected in parallel into several segments instead of maintaining it in the form of a single junction. Various methods of arrangement of these divided emitter regions are employed in the prior art, such as the arrangement of small segments of a rectangular (or strip-like) form in a single row consisting of equidistantly spaced segments with the longer sides of adjacent segments being positioned side by side. According to another method, the small segments are two-dimensionally arranged in the form of an $n \times m$ matrix with each segment being equidistantly spaced away from the adjacent segments.

However, in considering the temperature rise at the collector junction resulting from a plurality of emitter junctions equidistantly spaced and arranged in the manner described above, it is noted that the collector junctions immediately below the central portion of the transistor experience high temperature rises due to the influence of heat flow from adjacent junctions in comparison with the temperature rise at junctions in the peripheral portion of the transistor at which the divergence of heat flow is greater, so that the workable operating limit of the transistor is governed primarily by the junction temperature of the central area.

It is an object of the invention to provide a power transistor in which the possible adverse effects of collection junction heating are reduced or eliminated.

It is a further object of the present invention to remove the drawbacks of the emitter region arrangement (hereinafter referred to simply as the electrode arrangement) which has been employed in the prior art with respect to power transistors, and to arrange the divided emitter segments in a manner such that the temperature rise of their junctions becomes uniform.

According to the transistor electrode arrangement of the present invention, in determining the arrangement of a plurality of divided emitter junction segments, the intervals between adjacent emitter junction segments in the central portion of the arrangement are made relatively wide, while the intervals between adjacent emitter junction segments are progressively more narrow as their positions approach the peripheral portion of the arrangement, to adjust the divergence of heat flow from adjacent emitter junction segments. As a result of this arrangement, the divided junction regions all operate at a substantially uniform junction temperature.

To the accomplishment of the above and to such further objects as may hereinafter appear, the present invention relates to a planar electrode arrangement for a power transistor, substantially as defined in the appended claims and as described in the following specification taken together with the accompanying drawings in which:

Figure 1A:
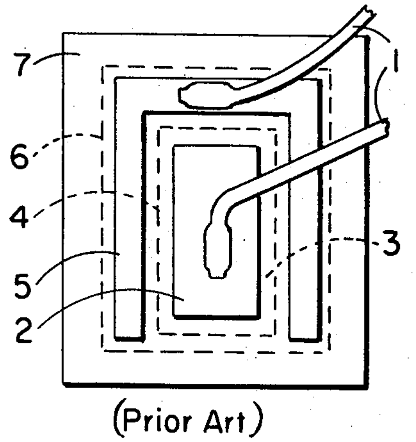
(Prior Art) FIG. 1A
FIG. 1A is a plan view of a conventional transistor.
Figure 1B:
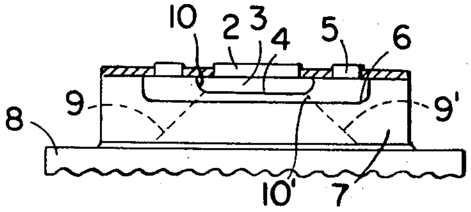
(Prior Art) FIG. 1B
FIG. 1B is a cross-sectional view of the transistor of FIG. 1A.

The prior art transistor shown in FIGS. 1A and 1B is composed of an electrode lead wire 1, an emitter electrode 2, an emitter region 3, an emitter junction 4, a base electrode 5, a collector junction 6, a collector region 7, and a heat radiator 8. A source of heat generation while the transistor is operating is a portion within the collector junction 6 sandwiched between broken lines 9 and 9' of FIG. 1B. The generated heat is transmitted within the semiconductor body through a diffusion phenomenon and flows toward the radiator 8, and, in this regard, the heat flow is calculated such that more than 90 percent of it is included within an area expanding at an angle of 45° as shown by the broken lines 9 and 9'. Considering a planar electrode structure, if a transistor having a single wide emitter as shown in FIGS. 1A and 1B is operated at a large current level, as is the case with a power transistor, the so-called emitter circumferential effect is produced so that a larger percentage of the emitter current becomes concentrated in a peripheral portion 10 and 10' of the emitter junction 4 in FIG. 1B. Thus, the central portion of the emitter junction is not sufficiently utilized.

Figure 2A:
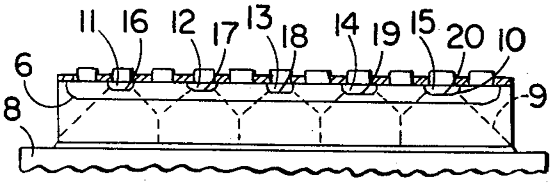
(Prior Art) FIG. 2A
FIG. 2A is a cross-sectional view of another conventional transistor.

To avoid the foregoing drawback, the structure shown in FIG. 2A is effective in which the emitter region is divided into a plurality of small rectangular segments, and the emitter perimeter is increased. The transistor structure of FIG. 2A includes divided emitter regions 11–15, respectively defining corresponding emitter junctions 16–20. In this prior art structure, however, all the emitters are arranged in equidistantly spaced relationship so that the temperatures of the collector junctions opposing the central portion emitters become extremely high in comparison with the temperatures of those emitters in the peripheral portion.

Figure 2B:
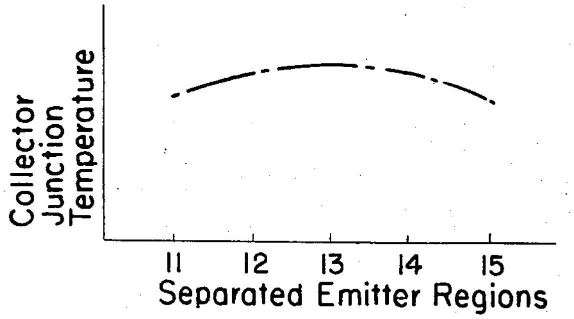
(Prior Art) FIG. 2B
FIG. 2B is a graph illustrating the temperature distribution in the transistor of FIG. *2a;*

This behavior is shown graphically in FIG. 2B, and the reasons for this behavior may be explained as follows: If the upper surface of the radiator 8 is taken to be a reference temperature surface, the heat generated in the collector junction 6 flows towards the radiator with a divergence angle of about 45°. However, while the heat flow lines emitted from the collector junctions in the peripheral portion diverge freely, the heat flow lines emitted from the central portion run across those emitted from adjacent portions to thereby cease to diverge, so that they enter into the radiator 8 with a width corresponding to the region pitch. Consequently, the radiating cross-sectional area of the central portion becomes narrow in comparison with that of the peripheral portion, and the temperatures of the collector junctions in the central portion become high. To solve this problem, it would be thought sufficient to widen the interval between adjacent emitter regions such that the heat flow lines diverging at an angle of 45° do not cross the adjacent heat flow lines. This arrangement is, however, undesirable, since an excessively larger amount of semiconductor material would be required.

In accordance with the present invention, in order to maintain the collector junction temperatures in the central portion within the range of a given semiconductor volume, the interval between adjacent emitter segments in the electrode arrangement is made relatively wide in the central portion and relatively narrow in the peripheral portion, in a manner achieving improved results, particularly with respect to obtaining more uniform collector junction temperatures.

Thus with reference to the embodiment of the invention as shown in FIG. 3, the transistor therein shown comprises a plurality of divided emitter regions 21–27 of a rectangular (or strip-like) form, and a common-base collector region 6. Emitter regions 21–27 are arranged in one row in such a manner that the emitter arrangement pitches $l_3, l_3'$ between adjacent divided emitter regions in the central portion of the transistor are relatively wide whereas the pitched $l_1, l_1'$ between adjacent divided emitter regions in the peripheral portion of the transistor are relatively narrow. The intermediate pitches $l_2$ and $l_2'$ between intermediate adjacent emitter regions are wider than pitches $l_1$ and $l_1'$ and less wide than pitches $l_3$ and $l_3'$.

Figure 3A:
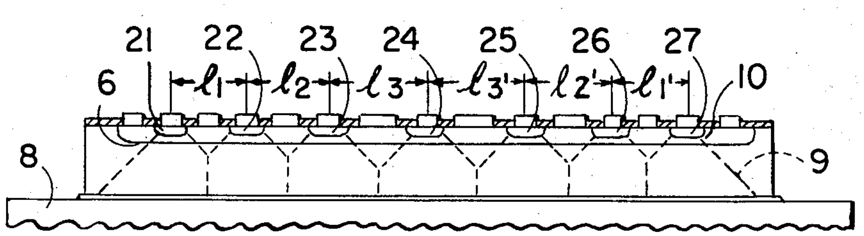
FIG. 3A is a cross-sectional view of a transistor according to one embodiment of this invention.
Figure 3B:
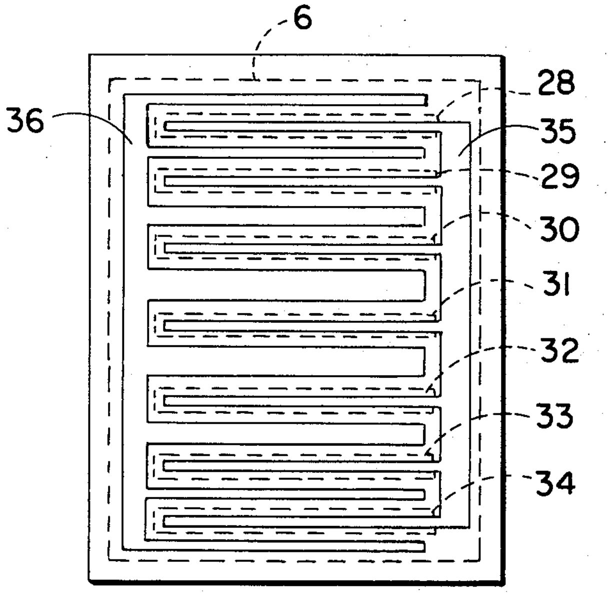
FIG. 3B is a plan view of an arrangement of planar metal electrodes of the transistor of FIG. 3A.
Figure 3C:
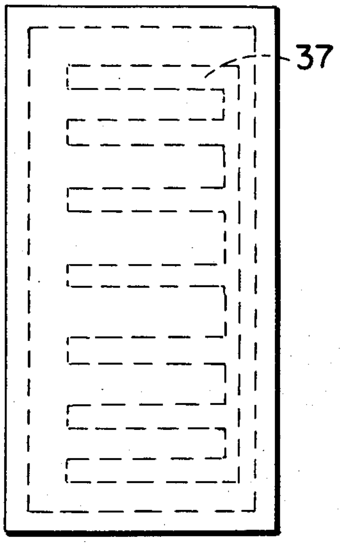
FIG. 3C is a plan view of a transistor arrangement according to another embodiment of this invention.

The pitches in respective portions of the transistor can be determined by means of calculation so that all the collector junctions on the whole surface will exhibit substantially a uniform temperature rise. According to the result of this calculation, it has become clear that good results are obtained if the emitter regions of the rectangular (or striplike) form are arranged according to the pitch relationship of $l_4>l_3\gg l_2>l_1$ in the case where there are between four and ten divided emitter regions, as in the case of this embodiment. Generally, the emitter regions may be arranged according to a pitch relationship of $l_1<l_2<l_3<l_4<l_5 = = l_n$ in the case where there are more than ten emitter regions. To give a definite numerical example, when there are nine emitter regions, it is good if they are arranged with an interval ratio of $l_4 l_3 : l_2 : l_1 = 1 : 0.95 : 0.84 : 0.68$. In the foregoing description, the respective emitter regions were considered to be independent of each other and to be connected to one another through an electrode metal to effect parallel operation. That is, they were considered to have a planar electrode structure as shown in FIG. 3B. As shown in FIG. 3B, an electrode metal 35 connects the independent emitter regions 28–34, and a metal electrode 36 is connected to the base. However, each emitter region need not necessarily be completely independent of the others. This invention can also be applied to the so-called comb-type electrode transistor, in which the emitter regions are formed, as shown in FIG. 3C, as a continued region 37, in which case, the effective working portions of the emitter exist in the "teeth" portions of the comb. The spacing between the "teeth" emitter portions are spaced as described above, with the greatest spacing being provided between the central regions and lowest at the outer periphery regions.

Figure 3D:
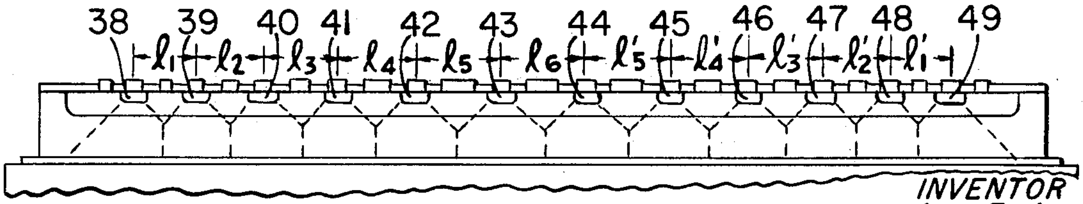
FIG. 3D is a cross-sectional view of a transistor according to a further embodiment of this invention.

When there are twelve (12) emitter regions 38–49 as illustrated in FIG. 3D, it is good if they are arranged with an interval ratio of $l_5 : l_4 : l_3 : l_2 : l_1 = 1 : 0.97 : 0.95 : 0.84 : 0.68$ and $l_5 = l_6$. In this structure the interval between adjacent ones of said emitter regions is made narrow at the peripheral portion in comparison with that between adjacent ones of said emitter regions at the central portion.

Figure 4A:
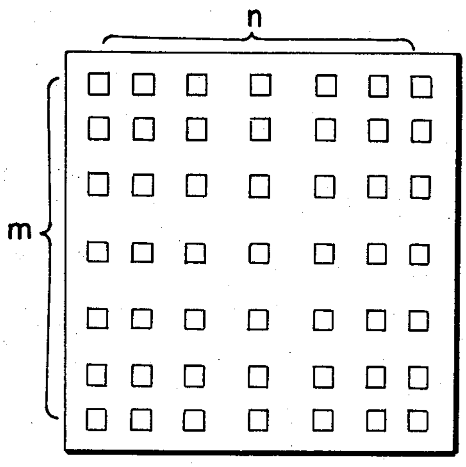
FIG. 4A is a plan view of a transistor arrangement according to a third embodiment of the invention.
Figure 4B:
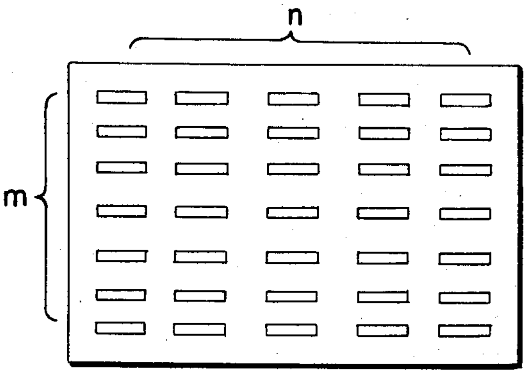
FIG. 4B is a plan view of a transistor arrangement according to a fourth embodiment.

FIGS. 4A and 4B illustrate third and fourth embodiments of the present invention. In order to avoid undue complexity, both FIGS. 4A and 4B show only arrangements of the divided emitter regions according to the present invention. That is, the collector junctions, base electrode metal, and emitter electrode metal are all omitted from these drawings. FIG. 4A illustrates the so-called "square overlay" electrode arrangement, and FIG. 4B illustrates the so-called "strip overlay" electrode arrangement. In accordance with the present invention, it will be clear that it is sufficient if a number of divided emitter regions disposed in the form of an $m \times n$ matrix are arranged two-dimensionally such that the pitches between adjacent emitter regions become gradually narrow as the positions of the divided regions approach from the central portion to the peripheral portion; or the pitches in the center portion are the same and become gradually narrow approaching the regions at the peripheral portion.

As an alternative embodiment, the present invention can also be applied to a structure in which there is a plurality of base regions relative to one collector region, and a plurality of effectively independent emitter regions positioned in respective base regions. This embodiment is very effective if its arrangement is applied to a high frequency large output transistor, and results in improved electrical characteristics.

As described hereinabove, when the electrode arrangement according to the present invention is applied to a power transistor, a relatively high power can be effectively dealt with by the use of a limited amount of semiconductor material and without adversely affecting almost all the other electrical characteristics of the transistor. The present arrangement is particularly effective when employed in a power transistor for operation at high frequencies.

If applied to a semiconductor device of the type in which heat is generated immediately below the emitter regions or at the collector junctions opposing the former with four or more emitter regions, the present invention can provide a very effective semiconductor device arrangement which satisfies the condition of minimizing the pellet area, and establishing substantially uniform temperature distribution of the generated heat.

Thus while only several embodiments of the present invention have been herein specifically described, it will be apparent that modifications may be made therein without departing from the spirit and scope of the invention.

I CLAIM:

1. A multi-emitter transistor comprising a collector region of a semiconductor substrate of a first conductivity type, a base region of a second opposite conductivity type formed in the surface of said substrate, and a plurality of emitter regions of said first conductivity type formed in a surface of said base region and arranged in an irregularly spaced relationship, wherein the distance between adjacent ones of said emitter regions located at the central portion of said substrate is greater than the distance between the emitter regions, located near the peripheral portion of said substrate.

2. The transistor of claim 1, in which said emitter regions are arranged in the form of a comb, and the interval between adjacent ones of said emitter regions is narrow in the peripheral portion in comparison with that between adjacent ones of said emitter regions and the central portion.

3. The transistor of claim 1, in which said emitter regions are arranged in a square overlaid form, and the interval between adjacent ones of said emitter regions is made narrow in the peripheral portion in comparison with that between adjacent ones of said emitter regions at the central portion.

4. The transistor of claim 1, in which said emitter regions are arranged in a strip overlaid form, and the interval between adjacent ones of said emitter regions is made narrow in the peripheral portion in comparison with that between adjacent ones of said emitter regions at the central portion.

5. The transistor as specified in claim 1, wherein said emitter regions in the central portion are arranged at the same interval, and said regions in the peripheral portion are spaced more closely together in comparison with those at the central portion.

6. The transistor of claim 1, in which there are nine of said emitter regions, and the intervals between adjacent ones of said regions preceding from the central portion to the peripheral portion are approximately in the ratio of 1: 0.95 : 0.84 : 0.68.

7. The transistor of claim 1, further comprising a conductor coupled in common to each of said emitter regions.

* * * * *